US012652955B2

(12) United States Patent
Lu et al.

(10) Patent No.: US 12,652,955 B2
(45) Date of Patent: Jun. 9, 2026

(54) POLYMER-DERIVED CERAMIC THIN FILM THERMOCOUPLE AND PREPARATION METHOD THEREOF

(71) Applicant: North University of China, Taiyuan (CN)

(72) Inventors: Xiaoling Lu, Taiyuan (CN); Lei Zhang, Taiyuan (CN); Yaping Xie, Taiyuan (CN); Qiulin Tan, Taiyuan (CN)

( * ) Notice: Subject to any disclaimer, the term of this patent is extended or adjusted under 35 U.S.C. 154(b) by 0 days.

(21) Appl. No.: 19/290,334

(22) Filed: Aug. 4, 2025

(65) Prior Publication Data

US 2025/0359483 A1      Nov. 20, 2025

(30) Foreign Application Priority Data

Nov. 7, 2024    (CN) .......................... 202411578004.8

(51) Int. Cl.
| | |
|---|---|
| *H10N 10/01* | (2023.01) |
| *C04B 35/626* | (2006.01) |
| *H10N 10/817* | (2023.01) |

(52) U.S. Cl.
CPC ......... *H10N 10/01* (2023.02); *C04B 35/6264* (2013.01); *C04B 2235/6562* (2013.01); *C04B 2235/6565* (2013.01); *H10N 10/817* (2023.02)

(58) Field of Classification Search
None
See application file for complete search history.

(56) References Cited

FOREIGN PATENT DOCUMENTS

CN      115628820 A   *   1/2023   ............... G01K 7/02

OTHER PUBLICATIONS

Machine translation of CN115628820A (Year: 2023).*
Q. Chen, et al., "Polymer-derived ceramic thin-film thermocouples for high temperature measurements", Ceramics International 49, 31248-31254 (Year: 2023).*
CNIPA Second Office Action, Application No. 202411578004.8, dated Jan. 8, 2025, pp. 1-11, Chinese original.
CNIPA Second Office Action, Application No. 202411578004.8, dated Jan. 8, 2025, pp. 1-14, English translation.

* cited by examiner

*Primary Examiner* — Ryan S Cannon

(57)      ABSTRACT

The present disclosure provides a polymer-derived ceramic thin film thermocouple and a preparation method thereof. The polymer-derived ceramic thin film thermocouple comprises an A electrode and a B electrode, wherein one end of the A electrode and one end of the B electrode intersect and overlap to form hot junctions, an end of the A electrode away from the hot junction and the end of the B electrode away from the hot junction are provided with solder joints. Each solder joint may be connected to a lead wire, the lead wire is configured for output a signal; the A electrode is prepared by mixing a polysilazane solution, nanocomposite powder and a xylene solution, and the nanocomposite is prepared by mixing indium oxide nanopowder, zinc oxide powder and anhydrous ethanol; the B electrode is prepared by mixing a polysilazane solution, indium oxide nanopowder, and a xylene solution.

7 Claims, 5 Drawing Sheets

POLYMER-DERIVED CERAMIC THIN FILM THERMOCOUPLE AND PREPARATION METHOD THEREOF

TECHNICAL FIELD

The present disclosure belongs to the technical field of temperature sensors, particularly to a polymer-derived ceramic thin film thermocouple and a preparation method thereof.

BACKGROUND

As the thrust-to-weight ratio of aircraft engines continues to increase, the surface temperature of engine blades has reached as high as 1500° C., which makes the real-time monitoring of the surface temperature distribution of engine blades rather challenging. Polymer-derived ceramics (PDC) have the advantages of strong thermal shock resistance and high temperature resistance, as well as being inexpensive. Their precursors are typically liquid and can be processed into paste-like films using methods such as direct writing, micro-jet printing, or screen printing, followed by heating, curing, cross-linking, and pyrolysis to prepare ceramic films. Ceramic films exhibit high sensitivity, controllability, patternability, and facilitation of film formation. Additionally, PDC is a semiconductor with a resistance that decreases with increasing temperature, exhibiting a specific functional relationship. This thermosensitive property can be utilized to fabricate thin-film temperature sensors.

Existing precursor ceramic thin-film sensors are prone to fall off due to mismatched thermal expansion coefficients between the ceramic substrate and metal materials. Apart from thermal effects, thin-film temperature sensors are also required to resist engine impact and vibration loads. Due to pores and gaps at the interface between the sensitive layer and substrate, the bonding strength between the sensitive layer and substrate decreases under impact and vibration, leading to potential fractures in the thin-film temperature sensor. Furthermore, most precursor ceramic materials are currently fabricated into bulk sensors, and are not suitable for thin-film temperature measurement, which poses significant limitations.

SUMMARY

In order to solve the above problems, the present disclosure provides a polymer-derived ceramic thin film thermocouple and a preparation method thereof.

In order to achieve the above objective, the present disclosure adopts the following technical scheme:

a polymer-derived ceramic thin film thermocouple, configured for monitoring a surface temperature of a hot component; the polymer-derived ceramic thin film thermocouple includes an A electrode and a B electrode, one end of the A electrode and one end of the B electrode intersect and overlap to form hot junctions, an end of the A electrode away from the hot junction and the end of the B electrode away from the hot junction are provided with solder joints.

each solder joint may be connected to a lead wire, and the lead wire is configured to output a signal;

the A electrode is prepared by mixing a polysilazane solution, nanocomposite powder and a xylene solution;

the B electrode is prepared by mixing a polysilazane solution, indium oxide nanopowder, and a xylene solution;

where the nanocomposite is prepared by mixing indium oxide nanopowder, zinc oxide powder and anhydrous ethanol.

Further optionally, in the A electrode, a mass fraction of the polysilazane solution is $M_{A1}$, a mass fraction of the nanocomposite powder is $M_{A2}$, a mass fraction of the xylene solution is $M_{A3}$, and the $M_{A1}$, $M_{A2}$ and $M_{A3}$ satisfy: $20\% \le M_{A1} \le 30\%$, $20\% < M_{A2} \le 30\%$, $40\% \le M_{A3} \le 60\%$;

in the B electrode, a mass fraction of the polysilazane solution is $M_{B1}$, a mass fraction of the indium oxide nanopowder is $M_{B2}$, a mass fraction of the xylene solution is $M_{B3}$, and the $M_{B1}$, $M_{B2}$ and $M_{B3}$ satisfy: $20\% \le M_{B1} \le 30\%$, $20\% < M_{B2} \le 30\%$, and $40\% \le M_{B3} \le 60\%$.

Further optionally, in the A electrode, the mass ratio of the polysilazane solution, the nanocomposite powder and the xylene solution is: 1:1:2; in the B electrode, the mass ratio of the polysilazane solution, the indium oxide nanopowder and the xylene solution is 1:1:2.

Further optionally, in the nanocomposite, an average particle diameter of the indium oxide nanopowder is $d_1$, an average particle diameter of the zinc oxide powder is $d_2$, and the $d_1$ and $d_2$ satisfy: 50 nm $\le d_1 \le 100$ nm, 20 nm $\le d_2 \le 100$ nm;

in the B electrode, an average particle diameter of the indium oxide nanopowder is $d_3$, and $d_3$ satisfies: 20 nm $\le d_3 \le 20$ um.

Further optionally, a thickness of the A electrode is $H_A$, a thickness of the B electrode is $H_B$, and the $H_A$ and Hp satisfy: 2 um $< H_A \le 100$ um, 2 um $< H_B \le 100$ um.

Further optionally, the solder joints are made by sintering a conductive slurry, and the conductive slurry is a polysilazane solution filled with titanium diboride nanopowder;

the lead wire has a filamentous structure, the lead wire is a platinum wire, and a diameter of the lead wire is $d_0$, and the $d_0$ satisfies: 160 um $\le d_0 \le 240$ um.

Further optionally, $d_0 = 200$ um.

A method for preparing a polymer-derived ceramic thin film thermocouple, wherein the polymer-derived ceramic thin film thermocouple is the polymer-derived ceramic thin film thermocouple according to any one of the above items; the preparation method includes:

S1, pretreatment: cleaning and drying alumina ceramic sheets;

S2, preparation of the nanocomposite powder: mixing the indium oxide nanopowder and the zinc oxide powder according to a first preset mass ratio $k_1$, mixing the mixed powder and anhydrous ethanol according to a second preset mass ratio $k_2$ and placing them in a ball milling tank of a ball mill; controlling the ball mill to grind, and drying the mixture to obtain the nanocomposite powder; a rotational speed of the ball mill during grinding is a preset rotational speed n, and a grinding duration is a first preset duration $t_1$; a temperature at the time of the drying treatment is a first preset temperature $T_1$;

wherein the $k_1$, $k_2$, n, $t_1$ and $t_1$ satisfy: $3 \le k_1 \le 5$, $0.1 \le k_2 \le 1$, 1600 rpm $\le n \le 2400$ rpm, 4 h $\le t_1 \le 6$ h, 80° C. $\le T_1 \le 120°$ C.;

S3, preparation of an A mixed slurry and a B mixed slurry: mixing the polysilazane solution, the nanocomposite powder and the xylene solution according to a third preset mass ratio $k_3$ to obtain the A mixed slurry; mixing the polysilazane solution, the indium oxide nanopowder and the xylene solution according to a fourth preset mass ratio $k_4$ to obtain the B mixed slurry; wherein the $k_3$ and $k_4$ satisfy: $1:1:3 \le k_3 \le 1:1:1$, $1:1:3 \le k_4 \le 1:1:1$;

S4, preparation of a polymer-derived ceramic A slurry and a polymer-derived ceramic B slurry: magnetically stirring the A mixed slurry at a normal temperature to obtain the polymer-derived ceramic A slurry; magnetically stirring the B mixed slurry at a normal temperature to obtain the polymer-derived ceramic B slurry;

S5, preparation of an A electrode and a B electrode: directly writing the polymer-derived ceramic A slurry on the alumina ceramic sheets and directly writing the polymer-derived ceramic B slurry on the alumina ceramic sheets by adopting a Weissenberg direct writing process; then, placing the alumina ceramic sheets directly written with the polymer-derived ceramic A slurry and the polymer-derived ceramic B slurry in a vacuum drying oven for heating and curing treatment, and placing the alumina ceramic sheets directly written with the polymer-derived ceramic A slurry and the polymer-derived ceramic B slurry in a vacuum tube furnace for sintering to obtain the A electrode and the B electrode;

S6, preparation of the solder joint: mixing titanium diboride nanopowder and polysilazane solution according to a fifth preset mass ratio $k_5$ to obtain a conductive slurry, applying the conductive slurry on the alumina ceramic sheets and sintering to obtain the solder joint; electrically connecting the solder joints and lead wires and placing them in a vacuum tube furnace for sintering;

wherein the $k_5$ satisfies: $1:3 \leq k_5 \leq 1:1$.

Further optionally, in S5, the alumina ceramic sheets directly written with the polymer-derived ceramic A slurry and the polymer-derived ceramic B slurry are placed in the vacuum drying oven for heating and curing treatment, and the temperature during the heat curing treatment is a second preset temperature $T_2$, and the duration is a second preset duration $t_2$.

Wherein the $T_2$ and $t_2$ satisfy: $100°$ C.$\leq T_2 \leq 300°$ C., $0.4$ h$\leq t_2 \leq 0.6$ h;

the alumina ceramic sheets directly written with the polymer-derived ceramic A slurry and the polymer-derived ceramic B slurry are placed in the vacuum tube furnace for sintering includes:

firstly, raising the temperature to a third preset temperature $T_3$ at a preset heating rate $v_1$, and maintaining the temperature for a third preset duration $t_3$, in this process, the polymer-derived ceramic A slurry and the polymer-derived ceramic B slurry undergo organic to inorganic transformation, and amorphous ceramic is generated;

secondly, raising the temperature to a fourth preset temperature $T_4$ at a preset heating rate $v_1$, and maintaining the temperature for a fourth preset duration $t_4$, in this process, the amorphous ceramic undergoes phase separation and crystallization to generate a polycrystalline ceramic; and finally, cooling the temperature to room temperature at a preset cooling rate $v_2$;

wherein $v_1$ and $v_2$ satisfy: $3°$ C./min$\leq v_1 \leq 7°$ C./min, $3°$ C./min$\leq v_2 \leq 7°$ C./min;

the $T_3$ and $t_3$ satisfy: $900°$ C.$\leq T_3 \leq 1100°$ C., $3$ h$\leq t_3 \leq 5$ h; the $T_4$ and $t_4$ satisfy: $1400°$ C.$\leq T_4 \leq 1800°$ C.; $3$ h$\leq t_4 \leq 5$ h.

Further optionally, S5 further includes:

placing the alumina ceramic sheets directly written with the polymer-derived ceramic A slurry and the polymer-derived ceramic B slurry in the vacuum tube furnace at high temperature for annealing treatment, so that a layer of oxidized phase is formed on the surface of the A electrode and the surface of the B electrode; the temperature at the time of the annealing treatment is a fifth preset temperature $T_5$, and a duration is a fifth preset duration $t_5$;

wherein $T_5$ and $t_5$ satisfy: $1000°$ C.$\leq T_5 \leq 1400°$ C., $8$ h$\leq t_5 \leq 12$ h.

Further optionally, in S6, the temperature at which the solder joint and the lead wire are electrically connected and placed in a vacuum tube furnace for sintering is a sixth preset temperature $T_6$, and the duration is a sixth preset duration to;

wherein $T_6$ and to satisfy: $700°$ C.$\leq T_6 \leq 900°$ C., $0.5$ h$\leq t_6 \leq 1.5$ h.

Further optionally, after S6, further includes:

S7, preparation of the protective layer precursor layer: mixing the titanium diboride nanopowder and yttria-stabilized zirconia (YSZ) nanopowder according to a sixth preset mass ratio $k_6$, incorporating the mixture into the polysilazane solution, and placing the mixture into the vacuum drying oven for heating and curing treatment, and then obtaining the protective layer precursor; the temperature at the time of the heat curing treatment is a seventh preset temperature $T_7$, and the duration is a seventh preset duration $t_7$;

taking the protective layer precursor as a target material, depositing the protective layer precursor on the top surface of the A electrode and the top surface of the B electrode by pulsed laser, and then vacuum pyrolyzing to obtain the protective layer precursor layer; during vacuum pyrolysis, raising the temperature to an eighth preset temperature $T_8$ at the preset heating rate $v_1$ and maintaining the temperature for an eighth preset duration $t_8$;

wherein the $k_6$ satisfies: $3:1 \leq k_6 \leq 5:1$; the $T_7$ and $t_7$ satisfy: $100°$ C.$\leq T_7 \leq 300°$ C., $0.4$ h$\leq t_7 \leq 0.6$ h; the $v_1$ satisfies: $3°$ C./min$\leq v_1 \leq 7°$ C./min; $T_8$ and to satisfy: $1400°$ C.$\leq T_8 \leq 1800°$ C., $3$ h$\leq t_8 \leq 5$ h.

Further optionally, a thickness of the protective layer precursor layer is $H_C$, and the $H_C$ satisfies: $2$ um$< H_C \leq 100$ um.

Compared with the prior art, the beneficial effects of the present disclosure are mainly that:

(1) the polymer-derived ceramic thin film thermocouple of the present disclosure includes the A electrode and the B electrode, wherein the A electrode is prepared by mixing polysilazane solution, nanocomposite powder powder and xylene solution, and the nanocomposite powder is prepared by mixing indium oxide nanopowder, zinc oxide powder and absolute ethanol; the B electrode is prepared by mixing polysilazane solution, indium oxide nanopowder and xylene solution; the thermal expansion coefficients of the ceramic substrate and the non-metallic material are matched, and the thin film thermocouple is not easy to break;

polysilazane in electrode A and electrode B is an inorganic polymer material composed of silicon and nitrogen. Polysilazane can form a cross-linked network structure through a thermal curing mechanism. This network structure endows polysilazane with excellent heat resistance (temperature resistance can reach more than $1600°$ C.), mechanical properties, good high-temperature electrical properties and strong oxidation resistance at high temperatures, and it can maintain structural stability at high temperatures. The Si—N bond of polysilazane has about 30% ionic bond characteristics, and the bond energy of Si—N bond is relatively small, which makes the Si—N bond easily transform into other types of new bonds in the reaction, which helps to form new compounds and enhance the heat resistance and weather resistance of compounds; these characteristics make the application of polysilazane solution in thermocouple electrode fabrication have potential advantages, particularly in sensors that work stably in high temperature environment;

(2) the present disclosure adopts pulse laser deposition to fabricate the protective layer precursor layer, which can keep the consistency of the thin film and the protective layer components, and can control the thin film components by introducing different gases during deposition; additionally, pulsed laser deposition is beneficial to accelerate the application of high-performance thin films in practical scenarios;

(3) the present disclosure adopts vacuum pyrolysis to prepare the precursor ceramic thin film thermocouple, which is different from the conventional pyrolysis to prepare the precursor ceramic thin film under protective gas such as argon and nitrogen. On the one hand, the vacuum pyrolysis can make the precursor ceramic organic slurry have a conductive function and can prepare the conductive sensitive film. On the other hand, due to the thermal effect, a large adhesive force is generated between the film layers.

BRIEF DESCRIPTION OF THE DRAWINGS

To explain the examples of the present disclosure or the technical solutions in the prior art more clearly, a brief introduction will be made to the accompanying drawings used in the examples or the description of the prior art. It is obvious that the drawings in the description below are only some examples of the present disclosure, and those ordinarily skilled in the art can obtain other drawings according to these drawings without creative work.

The structures, proportions, and sizes illustrated in this specification are merely to illustrate the content disclosed herein and are intended for the understanding and reading of those familiar with this technology. They are not intended to define the limitations on the implementation of the present disclosure and therefore have no substantive technical significance. Any modifications to the structure, changes in proportional relationships, or adjustments to size, which do not affect the efficacy or objectives achievable by the present disclosure, should still fall within the scope of the technical content disclosed in the present disclosure.

Figure 1:
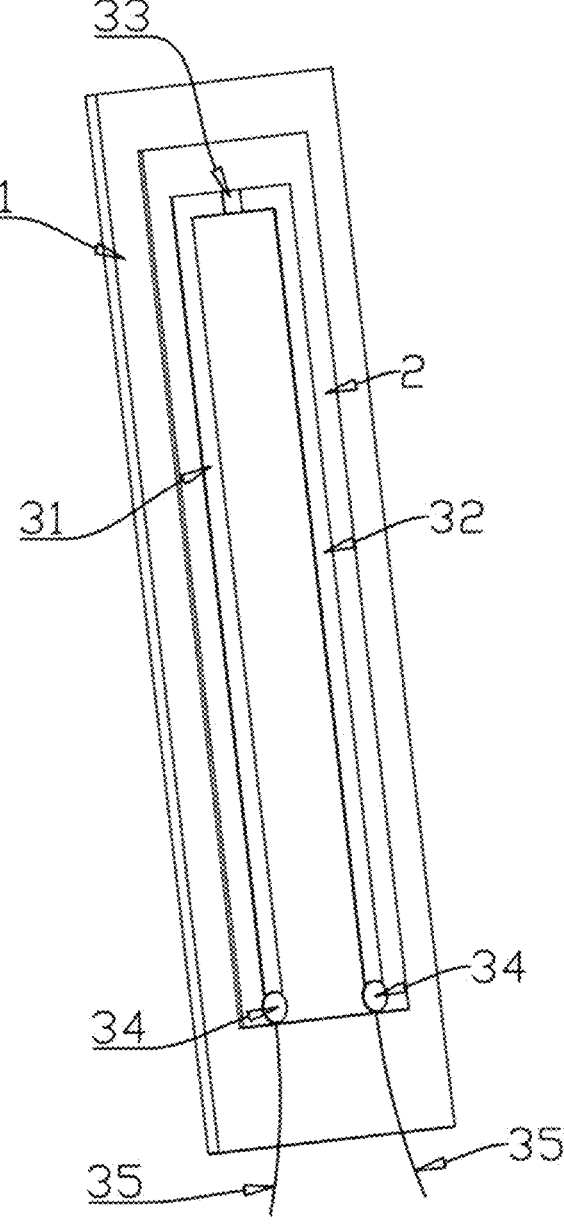
FIG. 1 is a schematic structural diagram of an example of a polymer-derived ceramic thin film thermocouple applied to the hot components provided by the present disclosure.

Reference numerals in figures: 1—a substrate; 2—a protective layer; 31—an A electrode; 32—a B electrode; 33—a hot junction; 34—a solder joint; 35—a lead wire; 41—a magnetic stirrer; 42—a direct writer; 421—a reservoir tube; 422—a rod member; 51—a laser; 52—a reflector; 53—a converging lens; 6—a housing; 61—a vacuum chamber; 62—an observation window; 63—a laser window; 71—a base; 72—a first rotating shaft; 73—a first drive motor; 81—a target material; 82—a second rotating shaft; 83—a second drive motor.

DETAILED DESCRIPTION OF THE EMBODIMENTS

The following specific examples are provided to illustrate the embodiments of the present disclosure. Those skilled in the art will readily appreciate other advantages and benefits of the present disclosure from the disclosure herein. Apparently, the described examples are only some but not all of the examples of the present disclosure. All other examples obtained by those of ordinary skill in the art based on the examples of the present disclosure without involving any creative effort shall fall within the scope of protection of the present disclosure.

The terms used in the examples of the present disclosure are used solely for the purpose of describing specific examples and are not intended to limit the scope of the present disclosure. The singular forms of "a," "the," and "said" used in the examples of the present disclosure and the appended claims are also intended to include plural forms, unless the context clearly indicates an alternative meaning. "Multiple" generally includes at least two, but does not exclude the possibility of including at least one.

It should be understood that the term "and/or" used in this document is merely a description of the relationship between related objects, indicating that three types of relationships may exist. For example, A and/or B may indicate three situations: A exists alone, A and B exist together, or B exists alone. Additionally, the character "/" in this document generally indicates that the related objects before and after it are in an "or" relationship.

It should also be noted that the terms "including," "including," or any other variations thereof are intended to cover non-exclusive inclusion, such that a product or system that includes a list of elements not only includes those elements but also includes other elements not explicitly listed, or elements inherent to such a product or system. In the absence of further restrictions, elements defined by the phrase "including one . . . " do not preclude the presence of additional identical elements in the goods or systems that include the specified elements.

In the existing precursor ceramic thin film sensor, the thermal expansion coefficient between the ceramic substrate and metal material is mismatched, leading to the thin-film temperature sensor falling off easily; the thin-film temperature sensor exhibits poor capability to withstand the impact and vibration loads from the engine. Under impact and vibration loads, the interfacial bonding strength between the sensitive layer and substrate decreases, potentially causing fracture of the thin-film temperature sensor;

the present disclosure creatively provides a polymer-derived ceramic thin film thermocouple, including the A electrode and the B electrode. The A electrode is prepared by mixing the polysilazane solution, the nanocomposite powder and the xylene solution, and the nanocomposite is made of indium oxide nanopowder, zinc oxide powder and anhydrous ethanol. The B electrode is prepared by mixing the polysilazane solution, the indium oxide nanopowder, and the xylene solution.

The thin film thermocouple is not easy to break, and the temperature resistance can reach greater than or equal to 1600° C. It also has excellent high-temperature electrical properties and high-temperature oxidation resistance.

Example 1

As shown in FIG. 1, this example provides a polymer-derived ceramic thin film thermocouple for monitoring the surface temperature of a hot component. The hot component refers to high-temperature parts and high-temperature devices, such as high-temperature components in the fields of aero-engines, gas turbines, nuclear power plants, and industrial chemicals. However, the application of the thermocouple is not limited to these fields. Any hot component employing a thermocouple for temperature measurement falls within the scope of this disclosure, those skilled in the art may modify the parameters according to different application scenarios, which constitutes a simple substitution under the technical concept of this embodiment.

The polymer-derived ceramic thin film thermocouple includes a substrate 1, a sensitive layer, a protective layer 2, solder joints 34, and lead wires 35. The substrate 1 is made of alumina ceramic sheets, the sensitive layer is disposed on the top surface of the substrate 1, and the protective layer 2 is disposed on the top surface of the sensitive layer; the sensitive layer includes the A electrode 31 and the B electrode 32 arranged opposite to each other, one end of the A electrode 31 and one end of the B electrode 32 intersect and overlap to form the hot junction 33, the ends of the A electrode 31 and the B electrode 32 away from the hot junction 33 are each provided with solder joints 34.

Each solder joint 34 is connected to the lead wire 35; the hot junction 33 serves as the temperature measurement point of the polymer-derived ceramic thin film thermocouple, the polymer-derived ceramic thin film thermocouple is connected to relevant detection devices via the lead wires 35, the electrical signals of the thermocouple are output through the lead wires 35.

The polymer-derived ceramic thin film thermocouple of the present application is primarily prepared by polymer-derived ceramics, the polymer-derived ceramics are ceramics obtained through vacuum pyrolysis of polymer precursors; the precursors are typically polymeric liquids that can be molecularly designed to exhibit specific properties. They offer a wide variety and have many optional materials, after curing, cross-linking, and pyrolysis, they transform into ceramic materials. Cross-linking and pyrolysis are decarbonization and dehydrogenation processes, during these processes, partial chemical bonds break, releasing gases such as $NH_3$, $H_2$, and $CH_4$. The volume shrinkage can exceed 50%, making the material prone to cracking, particulate fillers are commonly used to offset the volume shrinkage. At 1600° C., the pyrolyzed material exhibits high electrical conductivity, and its properties can be further tailored by adding particulate fillers.

Accordingly, in this application, the A electrode 31 is prepared by mixing the polysilazane solution, nanocomposite powder, and xylene solution in a predetermined ratio. The nanocomposite is prepared by mixing indium oxide nanopowder, zinc oxide powder and anhydrous ethanol in a predetermined ratio, the chemical formula of the nanocomposite is $In_{1.35}ZnO_{2.11}$. The B electrode 32 is prepared by mixing the polysilazane solution, indium oxide nanopowder, and xylene solution in a predetermined ratio. The polymer-derived ceramic thin film thermocouple can withstand temperatures exceeding 1600° C. and exhibits excellent high-temperature electrical properties and strong oxidation resistance;

specifically, both A electrode 31 and B electrode 32 are L-shaped structures, and the combination of A electrode 31 and B electrode 32 forms a U-shaped structure.

Further, in the A electrode, the mass fraction of the polysilazane solution is $M_{A1}$, the mass fraction of the nanocomposite powder is $M_{A2}$, the mass fraction of the xylene solution is $M_{A3}$, and the $M_{A1}$, $M_{A2}$ and $M_{A3}$ satisfy: $20\% \leq M_{A1} \leq 30\%$, $20\% < M_{A2} \leq 30\%$, $40\% \leq M_{A3} \leq 60\%$; that is, A electrode 31 is prepared by mixing polysilazane solution, nanocomposite powder and xylene solution according to the mass ratio of $M_{A1}:M_{A2}:M_{A3}$;

in the B electrode, the mass fraction of the polysilazane solution is $M_{B1}$, the mass fraction of the indium oxide nanopowder is $M_{B2}$, the mass fraction of the xylene solution is $M_{B3}$, and the $M_{B1}$, $M_{B2}$ and $M_{B3}$ satisfy: $20\% \leq M_{B1} \leq 30\%$, $20\% < M_{B2} \leq 30\%$, and $40\% \leq M_{B3} \leq 60\%$, that is, B electrode 32 is prepared by mixing polysilazane solution, indium oxide nanopowder and xylene solution according to the mass ratio of $M_{B1}:M_{B2}:M_{B3}$.

Preferably, A electrode 31 is prepared by mixing polysilazane solution, nanocomposite powder and xylene solution in a mass ratio of 1:1:2; B electrode 32 is prepared by mixing polysilazane solution, indium oxide nanopowder and xylene solution at a mass ratio of 1:1:2.

This example also proposes that in the nanocomposite, the average particle diameter of the indium oxide nanopowder is $d_1$, the average particle diameter of the zinc oxide powder is $d_2$, and the $d_1$ and $d_2$ satisfy: $50\ \text{nm} \leq d_1 \leq 100\ \text{nm}$, $20\ \text{nm} \leq d_2 \leq 100\ \text{nm}$;

in the B electrode, the average particle diameter of the indium oxide nanopowder is $d_3$, and $d_3$ satisfies: $20\ \text{nm} \leq d_3 \leq 20\ \text{um}$.

The thickness of the A electrode is $H_A$, the thickness of the B electrode is $H_B$, and the $H_A$ and $H_B$ satisfy: $2\ \text{um} < H_A \leq 100\ \text{um}$, $2\ \text{um} < H_B \leq 100\ \text{um}$.

Additionally, the solder joints 34 are made by sintering the conductive slurry, and the conductive slurry is the polysilazane solution filled with titanium diboride nanopowder; which is used to connect the lead wires 35, and it is not easy to fall off after curing;

the lead wire 35 has a filamentous structure, the lead wire 35 is the platinum wire, and the diameter of the lead wire 35 is $d_0$, and the $d_0$ satisfies: $160\ \text{um} \leq d_0 \leq 240\ \text{um}$; preferably, $d_0 = 200\ \text{um}$. The lead wire 35 is used to output the electrical signal of the thermocouple and connect the relevant detection devices at the same time. The length of the lead wire 35 can be adjusted as required.

Example 2

Figure 2:
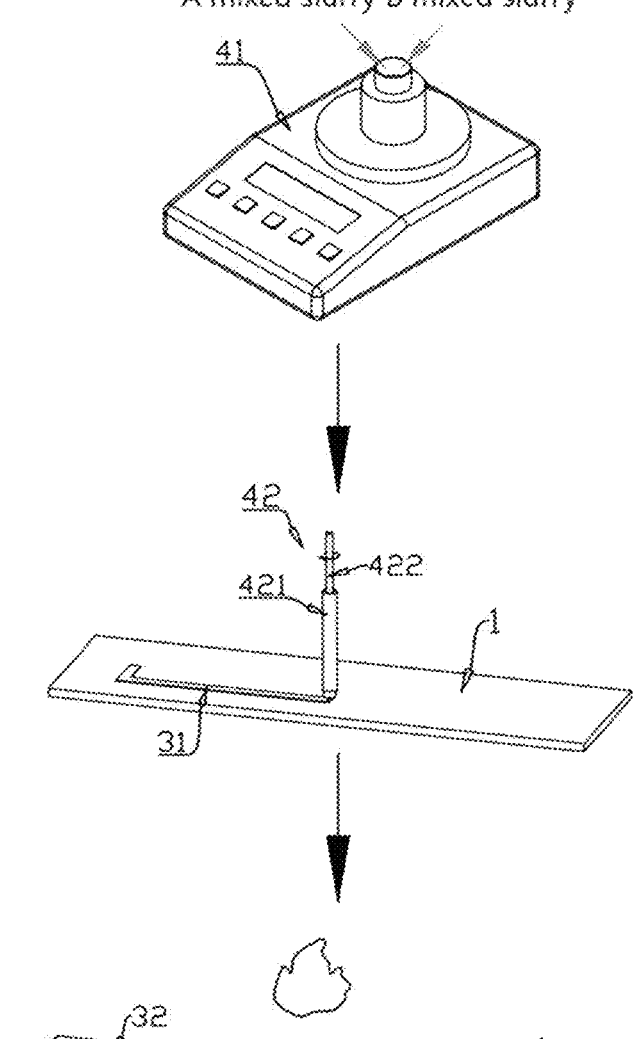
FIG. 2 is a schematic diagram of a process flow for preparing a polymer-derived ceramic thin film thermocouple provided by the present disclosure.

As shown in FIG. 2, on the basis of example 1, this example provides a method for preparing a polymer-derived ceramic thin film thermocouple, including:

S1, pretreatment: the alumina ceramic sheets are cleaned and dried in sequence;

specifically, in S1, the length×width×thickness of the alumina ceramic sheet is 80 mm×20 mm×1 mm. The surface of the alumina ceramic sheet with a size of 80 mm×20 mm×1 mm is ultrasonically cleaned with acetone, anhydrous ethanol and deionized water for 15 min. After cleaning, the surface of the alumina ceramic sheet is dried with a nitrogen gun, and then dried at 100° C.;

S2, preparation of the nanocomposite powder: indium oxide nanopowder and zinc oxide powder are mixed in a predetermined ratio, and the mixed powder and anhydrous ethanol are mixed in a predetermined ratio and placed in the ball milling tank of the ball mill; the ball mill is controlled to grind, and the mixture is dried to obtain nanocomposite powder;

specifically, in S2, the indium oxide nanopowder and the zinc oxide powder are mixed according to the first preset mass ratio $k_1$, the mixed powder and anhydrous ethanol are mixed according to the second preset mass ratio $k_2$; the rotational speed of the ball mill during grinding is the preset rotational speed n, and the grinding duration is the first preset duration $t_1$; the temperature at the time of the drying treatment is the first preset temperature $T_1$;

wherein the $k_1$, $k_2$, n, $t_1$ and $t_1$ satisfy: $3 \leq k_1 \leq 5$, $0.1 \leq k_2 \leq 1$, 1600 rpm $\leq n \leq 2400$ rpm, 4 h $\leq t_1 \leq 6$ h, 80° C. $\leq T_1 \leq 120°$ C.;

preferably, $k_1=4$, $k_2=0.5$, n=2000 rpm, $t_1=5$ h, $T_1=100°$ C.;

S3, preparation of the A mixed slurry and the B mixed slurry: the polysilazane solution, the nanocomposite powder and the xylene solution are mixed in a predetermined ratio to obtain the A mixed slurry; the polysilazane solution, the indium oxide nanopowder and the xylene solution are mixed in a predetermined ratio to obtain the B mixed slurry;

specifically, in S3, the polysilazane solution, the nanocomposite powder and the xylene solution are mixed according to the third preset mass ratio $k_3$ to obtain the A mixed slurry; the polysilazane solution, the indium oxide nanopowder and the xylene solution are mixed according to the fourth preset mass ratio $k_4$ to obtain the B mixed slurry; wherein the $k_3$ and $k_4$ satisfy: 1:1: $3 \leq k_3 \leq 1:1:1$, $1:1:3 \leq k_4 \leq 1:1:1$; preferably, $k_3=k_4=1:1:2$;

S4, preparation of the polymer-derived ceramic A slurry and the polymer-derived ceramic B slurry: the A mixed slurry is magnetically stirred at the normal temperature by the magnetic stirrer 41 to obtain the polymer-derived ceramic A slurry; the B mixed slurry is magnetically stirred at the normal temperature by the magnetic stirrer 41 to obtain the polymer-derived ceramic B slurry;

specifically, in S4, the magnetic stirring duration of A mixed slurry and B mixed slurry at room temperature is 120 min;

S5, preparation of the A electrode and the B electrode: in the Weissenberg direct writing device, the polymer-derived ceramic A slurry is directly written on the alumina ceramic sheets and the polymer-derived ceramic B slurry is directly written on the alumina ceramic sheets by adopting the Weissenberg direct writing process (CN110962220B has been published); then, the alumina ceramic sheets directly written with the polymer-derived ceramic A slurry and the polymer-derived ceramic B slurry are placed in the vacuum drying oven for heating and curing treatment, so that polymer-derived ceramic A slurry and the polymer-derived ceramic B slurry are cured and cross-linked, and then placed in the vacuum tube furnace for sintering to obtain the A electrode 31 and B electrode 32;

specifically, in S5, the alumina ceramic sheets directly written with the polymer-derived ceramic A slurry and the polymer-derived ceramic B slurry are placed in the vacuum drying oven for heating and curing treatment, and the temperature during the heat curing treatment is the second preset temperature $T_2$, and the duration is the second preset duration $t_2$;

wherein the $T_2$ and $t_2$ satisfy: 100° C. $\leq T_2 \leq 300°$ C., 0.4 h $\leq t_2 \leq 0.6$ h;

preferably, $T_2=200°$ C., $t_2=0.5$ h;

The Weissenberg direct writing device includes an X-Y axis movable platform and a direct writer 42 positioned above the X-Y axis movable platform, the direct writer 42 includes a reservoir tube 421 and a rod member 422, a microchannel is formed at the bottom of the reservoir tube 421, the microchannel is communication with the interior of the reservoir tube 421, and the microchannel is vertically arranged in the vertical direction; the rod member 422 is disposed within the reservoir tube 421, the bottom of the rod member 422 is needle-shaped, and the bottom of the rod member 422 extends beyond the microchannel, the top of the rod member 422 is drivingly connected to a direct current motor. When the direct writing device is used for direct-writing polymer ceramic precursors, the polymer ceramic precursor solution is first injected into the reservoir tube 421, and the substrate 1 is affixed to the X-Y axis movable platform. The direct current motor is activated and its rotational speed adjusted to rotate the rod member 422 at a predetermined speed within the reservoir tube 421, ensuring a stable liquid supply. By adjusting the distance between the bottom of the rod member 422 and the substrate 1, and controlling the movement of the X-Y axis movable platform, a polymer-derived ceramic sensitive film is directly written onto the substrate 1.

The alumina ceramic sheets directly written with the polymer-derived ceramic A slurry and the polymer-derived ceramic B slurry are placed in the vacuum tube furnace for sintering, including:

firstly, the temperature is raised to the third preset temperature $T_3$ at the preset heating rate $v_1$, and the temperature is maintained for the third preset duration $t_3$, in this process, the polymer-derived ceramic A slurry and the polymer-derived ceramic B slurry undergo organic to inorganic transformation, and amorphous ceramic is generated;

secondly, the temperature is raised to the fourth preset temperature $T_4$ at the preset heating rate $v_1$, and the temperature is maintained for the fourth preset duration $t_4$, in this process, the amorphous ceramic undergoes phase separation and crystallization to generate the polycrystalline ceramic; and finally, the temperature is cooled to room temperature at the preset cooling rate $v_2$;

wherein $v_1$ and $v_2$ satisfy: 3° C./min $\leq v_1 \leq 7°$ C./min, 3° C./min $\leq v_2 \leq 7°$ C./min;

the $T_3$ and $t_3$ satisfy: 900° C. $\leq T_3 \leq 1100°$ C., 3 h $\leq t_3 \leq 5$ h;

the $T_4$ and $t_4$ satisfy: 1400° C. $\leq T_4 \leq 1800°$ C.; 3 h $\leq t_4 \leq 5$ h.

preferably, $v_1=v_2=5°$ C./min; $t_3=1000°$ C., $t_3=4$ h, $T_4=1600°$ C., $t_4=4$ h;

S6, preparation of the solder joint 34: the titanium diboride nanopowder and polysilazane solution are mixed according to the fifth preset mass ratio $k_5$ to obtain the conductive slurry, the conductive slurry is applied on the alumina ceramic sheets and sintered to obtain the solder joints 34; the solder joints 34 and lead wires are electrically connected and placed them in the vacuum tube furnace for sintering; they are taken out after cooling to room temperature;

specifically, in S6, the temperature at which the solder joint and the lead wire are electrically connected and placed in the vacuum tube furnace for sintering is the sixth preset temperature $T_6$, and the duration is the sixth preset duration to;

wherein $k_5$ satisfies: $1:3 \leq k_5 \leq 1:1$; $T_6$ and to satisfy: $700°$ C.$\leq T_6 \leq 900°$ C., $0.5$ h$\leq t_6 \leq 1.5$ h;

preferably, $k_5 = 2:3$; $T_6 = 800°$ C., $t_6 = 1$ h;

S7, preparation of the protective layer precursor layer: the titanium diboride nanopowder and YSZ nanopowder are mixed according to the sixth preset mass ratio $k_6$, incorporated the mixture into the polysilazane solution, and placed the mixture into the vacuum drying oven for heating and curing treatment, and then the protective layer precursor is obtained; the temperature at the time of the heat curing treatment is the seventh preset temperature $T_7$, and the duration is the seventh preset duration $t_7$; the protective layer precursor has good compactness, which can improve the oxidation resistance of the sensor;

specifically, titanium diboride nanopowder and YSZ nanopowder are mixed into the polysilazane solution to prepare the protective layer precursor layer offers the following advantages: ① thermal stability is enhanced: the addition of nanoparticles improves the thermal stability and high-temperature oxidation resistance of the polysilazane-based protective layer; ② mechanical properties are improved: the incorporation of nanoparticle enhances the mechanical strength and hardness of polysilazane, the interface between nanoparticles and the polysilazane matrix inhibits crack propagation, thereby improving the fracture toughness and wear resistance of the material; ③ chemical stability is enhanced: nanoparticles improve the chemical stability of material, to resist corrosion and oxidation; ④ thermal curing reaction is accelerated: nanoparticles may act as catalysts or accelerators, to accelerate the thermal curing reaction of polysilazane, lower the curing temperature, and shorten the curing time; ⑤ wear resistance is increased: the addition of nanoparticles increases surface roughness and hardness of material, thereby enhancing wear resistance; ⑥ thermal shock resistance is improved: the incorporation of nanoparticles enhances the thermal shock resistance of the material, that is, the ability to withstand rapid temperature changes without cracking; ⑦ electrical properties are optimized: doping of nanoparticles can adjust the conductivity or dielectric properties of polysilazane.

The protective layer precursor is taken as the target material, the protective layer precursor is deposited on the top surface of the A electrode 31 and the top surface of the B electrode 32 by pulsed laser, and then vacuum pyrolyzed to obtain the protective layer precursor layer; during vacuum pyrolysis, the temperature is raised to an eighth preset temperature $T_8$ at the preset heating rate $v_1$ and the temperature is maintained for an eighth preset duration $t_5$; it has strong oxidation resistance, which can protect the polymer-derived ceramic sensitive film from oxidation.

wherein the $k_6$ satisfies: $3:1 \leq k_6 \leq 5:1$; the $T_7$ and $t_7$ satisfy: $100°$ C.$\leq T_7 \leq 300°$ C., $0.4$ h$\leq t_7 \leq 0.6$ h; the $v_1$ satisfies: $3°$ C./min$\leq v_1 \leq 7°$ C./min; $T_8$ and to satisfy: $1400°$ C.$\leq T_8 \leq 1800°$ C., $3$ h$\leq t_8 \leq 5$ h;

preferably, $k_6 = 4:1$, $T_7 = 200°$ C., $t_7 = 0.5$ h, $v_{1=5}°$ C./min, $T_8 = 1600°$ C., $t_8 = 4$ h;

specifically, in S7, when the titanium diboride nanopowder and YSZ nanopowder are incorporated into the polysilazane solution, the mass fraction of the titanium diboride nanopowder is 40%, and the average particle diameter of the titanium diboride nanopowder is 50 nm. The mass fraction of YSZ nanopowder is 10%, and the average particle diameter of YSZ nanopowder is 50 nm;

further, the thickness of the protective layer precursor layer is $H_C$, and $H_C$ satisfies: $2$ um$<H_C \leq 100$ um;

specifically, the vacuum heating method for curing, cross-linking and pyrolysis has the following advantages: ① removal of solvent and volatile components: polysilazane is heated under vacuum conditions, which can effectively remove solvents and other volatile components, the formation of pores and defects in the material can be avoided; ② cross-linking reaction: at a predetermined temperature, the small molecular fragments generated by decomposition can recombine to form a three-dimensional network structure through cross-linking reactions. This cross-linking enhances the mechanical strength and thermal stability of the material; ③ formation of ceramic phase: as the pyrolysis process continues, the cross-linked network structure further transforms into inorganic ceramic phases such as $Si_3N_4$, SiC, or $SiO_2$. These ceramic phases exhibit excellent high-temperature stability and mechanical properties; ④ stress relief: the vacuum environment is helpful for reducing thermal stress generated during the curing process, as the absence of atmospheric pressure under vacuum conditions allows the material to expand and contract freely; ⑤ uniform curing: the absence of oxygen under vacuum conditions prevents oxidation reactions, thereby achieving in a more uniform curing process; ⑥ purity is increased: vacuum heating reduces impurity content in the material, the purity and performance of the final product are improved; ⑦ microstructure control: by precisely controlling the temperature, time, and pressure of vacuum heating, the microstructure of the material, such as grain size, porosity, and phase composition, can be adjusted.

Figure 3:
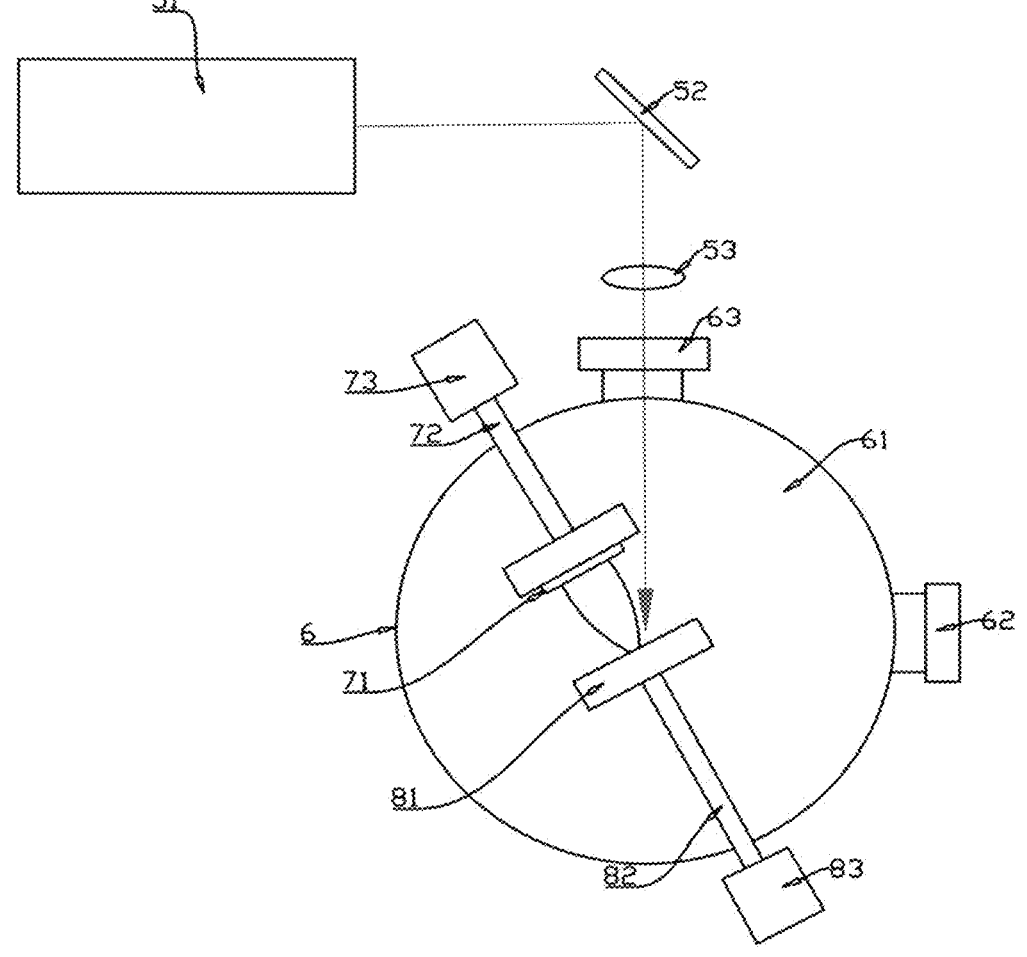
FIG. 3 is a schematic structural diagram of an example of a pulsed laser deposition system provided by the present disclosure.

As shown in FIG. 3, the PLD-450 pulsed laser deposition system is used in this example, and the system mainly includes several: a laser 51, an optical path system, a control panel and a vacuum system; the laser 51 is a COMPex201F KrF excimer pulsed laser; the optical path system includes a reflector 52 and a converging lens 53, wherein adjustment of the reflector 52 and converging lens 53 can modify the spot size and position of the laser beam on the target material 81; the control panel is configured to control deposition parameters, such as vacuum level, temperature of base 71, and rotational speeds of the target material 81 and base 71; the vacuum system, being the core part of the pulsed-laser deposition (PLD) system, determines the thin film growth environment and quality; the vacuum system includes a housing 6, a mechanical pump and a molecular pump, a vacuum chamber 61 is formed inside the housing 6, the housing wall of the housing 6 has an observation window 62 and a laser window 63. The interior of the vacuum chamber 61 can be observed through the observation window 62, while the laser generated by the pulsed laser enters the vacuum chamber 61 via the laser window 63; the mechanical pump serves as the precursor pump for the molecular pump, evacuating the vacuum chamber 61 to below 0.1 Pa to provide a high-vacuum working environment for the molecular pump; the housing wall of the housing 6 further includes a first shaft hole and a second shaft hole, a first rotating shaft 72 is disposed through the first shaft hole, while a second rotating shaft 82 is disposed through the second shaft hole, both the base 71 and the target material 81 are arranged inside the vacuum chamber 61, whereas the first drive motor 73 and second drive motor 83 are arranged outside the vacuum chamber 61. One end of the first rotating shaft 72 is provided with the base 71, while the other end of the first rotating shaft 72 is drivingly connected to the first drive motor 73, and the first drive motor 73 can drive the base 71 to rotate when running; one end of the second rotating shaft 82 is provided with the target material 81, the other end of the second rotating shaft 82 is drivingly connected to the second drive motor 83, the second rotating shaft 82 can drive the target material 81 to rotate. The base 71 can reach a maximum temperature of 1000° C., the rotational speeds of both the target material 81 and base 71 should not exceed 2 rad/s, and the minimum adjustable distance between the target material 81 and base 71 may be 6 cm.

Before deposition, the alumina ceramic sheet directly written with A electrode 31 and B electrode 32 is masked, then the alumina ceramic sheet directly written with A electrode 31 and B electrode 32 IS fixed at the position of base 71, and the base 71 is arranged in the vacuum chamber 61 and is connected to first rotating shaft 72; similarly, target material 81 is arranged in vacuum chamber 61 and connected to second rotating shaft 82. Pulsed laser deposition requires a high-vacuum thin film growth environment. Firstly, the mechanical pump is activated to evacuate the vacuum to below 10 pa, then the cooling water and molecular pump (the cooling water prevents damage to the molecular pump from excessive operating temperatures) are turned on. When the vacuum reaches below $5 \times 10^{-4}$ pa, the deposition can be started, and the deposition time is 40 min. Before the thin film deposition, target material 81 requires approximately 10 minutes of pre-sputtering to remove surface contaminants on the target material 81.

Pulsed laser 51 emits a laser beam that enters the vacuum chamber 61 through reflector 52, converging lens 53, and laser window 63, then focuses on target material 81. The surface of target material 81 is instantaneously heated, melted, and vaporized, also generating high-temperature and high-pressure plasma. This plasma then transfers from target material 81 to base 71 to form a plume, the plume grows into a protective film on the alumina ceramic sheet directly written with A electrode 31 and B electrode 32.

As the base 71 temperature rises, laser-excited particles move to the base 71 to obtain sufficient energy for surface migration, combine with other particles to form crystalline grains, thereby accelerating the thin film growth rate. With increasing deposition rates, film thickness correspondingly increases.

After preparation, the polymer-derived ceramic thin film thermocouple is tested from room temperature to 1600° C. One end of the thin film thermocouple hot junction 33 is placed in a high-temperature furnace, with a standard S-type thermocouple positioned directly above the same cross-section of hot junction 33 for synchronous temperature measurement of hot junction 33. The thermocouple cold junction (solder point 34) is placed on a water-cooled platform, with a K-type thermocouple aligned flush with the cold junction for synchronous cold-end temperature measurement. The resistance voltage output and temperatures of the thermocouple measured by both thermocouples at cold/hot junctions are simultaneously acquired by a multifunctional data acquisition system.

Adopting PLD for protective layer precursor layer offers the following advantages: ① high compositional fidelity: PLD technology can produce thin films with identical composition to the target material; ② high deposition rate: compared with other deposition processes, PLD technology features rapid reaction and high deposition rates; ③ strong directionality: PLD technology exhibits excellent directionality, enabling high-resolution thin film deposition, facile micro-zone deposition, and the preparation of functional films with fine grain size and microstructure; ④ deposition of chemically complex materials: PLD technology can be fully equivalent to the coating of composite materials with complex chemical composition; ⑤ broad application scope: PLD technology may prepare nearly all thin film materials, demonstrating significant development potential and wide-ranging application prospects; ⑥ low-temperature deposition: PLD enables deposition at relatively low temperatures, which is particularly advantageous for temperature-sensitive materials and substrates; ⑦ ultrashort pulse laser applications: ultrashort pulse lasers has extremely high peak power, generating high-kinetic-energy ions that facilitate precise control, thereby enabling the preparation of nano-films with unique structures; ⑧ combined with other deposition techniques: PLD can be combined with other deposition methods to develop novel thin film preparation technologies, further enhancing film quality.

Figure 4:
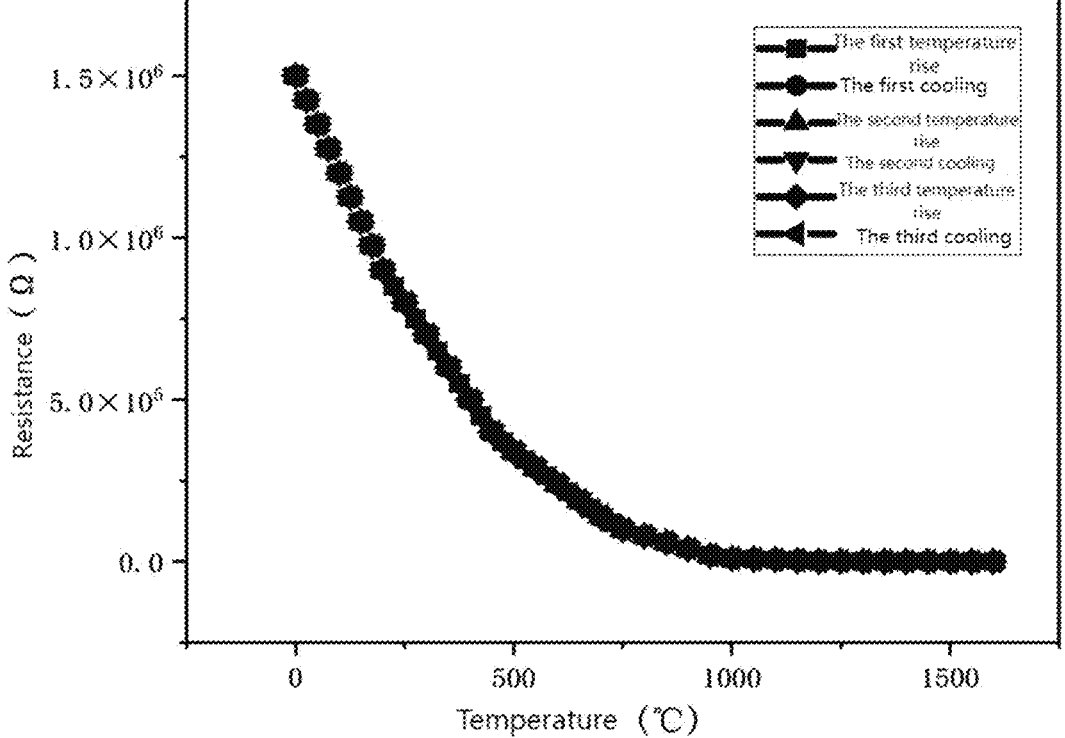
FIG. 4 is a schematic diagram of a three-cycle test curve of a polymer-derived ceramic thin film thermocouple resistance with temperature change provided by the present disclosure.

The resistance variation of the polymer-derived ceramic thin-film thermocouple according to the present disclosure is experimentally tested over a temperature range of 0° C. to 1600° C., the size of the thermocouple during testing are as follows: the length×width×thickness of the alumina ceramic sheet is 80 mm×20 mm×1 mm, while the length×width×thickness of A electrode 31 and B electrode 32 is 74 mm×3 mm×10 μm. The test conditions are: cold junction temperature maintained at 0° C., hot junction initial temperature set at 0° C., with test at intervals of 50° C. until the temperature of the hot junction reaches 1600° C. FIG. 4 is the three-cycle test curve of a polymer-derived ceramic thin film thermocouple resistance with temperature change from 0° C. to 1600° C. As shown in FIG. 4, the prepared polymer-derived ceramic thin film thermocouple prepared by the present disclosure has good repeatability, excellent high-temperature electrical properties, strong oxidation resistance, and reliable operation at 1600° C., showing that the thin film thermocouple does not break, and there is a large adhesion between the films.

Figure 5:
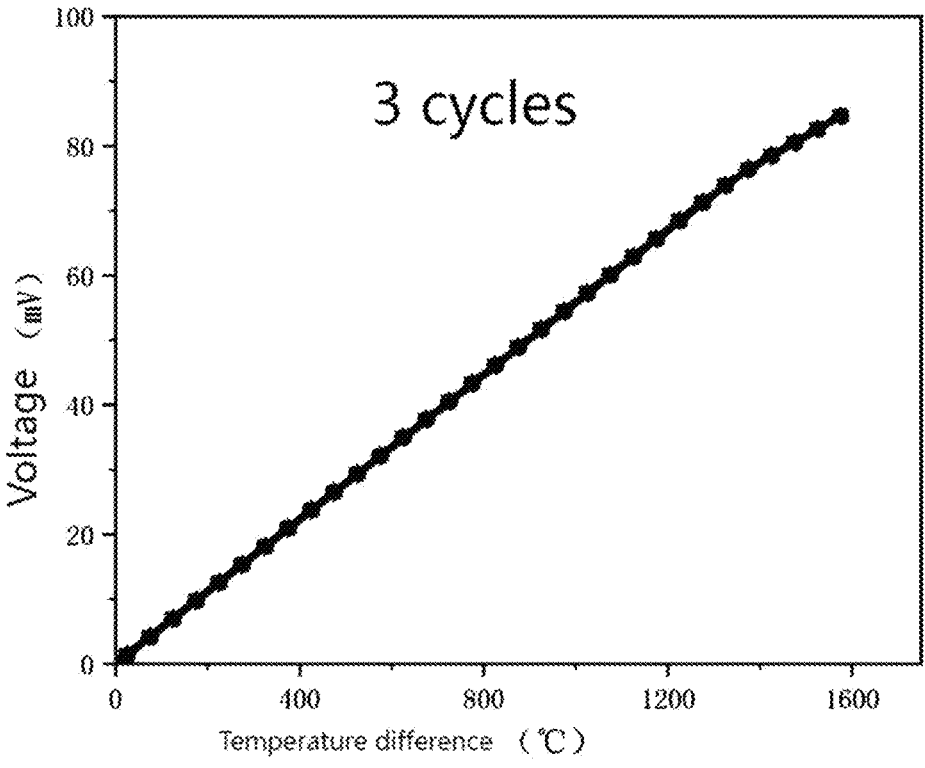
FIG. 5 is a schematic diagram of a thermoelectric response output of a polymer-derived ceramic thin film thermocouple provided by the present disclosure.

The thermoelectric response output of the polymer-derived ceramic thin-film thermocouple is experimentally tested from room temperature to 1600° C. The size of the thermocouple during testing is as follows: the length×width×thickness of the alumina ceramic sheet is 80 mm×20 mm×1 mm., while the length×width×thickness of A electrode 31 and B electrode 32 is 74 mm×3 mm×10 μm. The test conditions are: cold junction temperature maintained at 20° C., hot junction initial temperature set at 20° C., with simulations are performed at intervals of 50° C. until the temperature of the hot junction reaches 1600° C. FIG. 5 is the measured thermoelectric response of the polymer-derived ceramic thin film thermocouple. It can be seen from FIG. 5 that the polymer-derived ceramic thin film thermocouple prepared by the present disclosure has very good repeatability and very stable output. The maximum output voltage is 84.6 mV, and the Seebeck coefficient is about 55.8 uV/° C., which indicates that the thin film thermocouple does not break and there is a large adhesion between the films.

In summary, in terms of materials, the polymer-derived ceramic thin film thermocouple includes the A electrode 31 and the B electrode 32. The A electrode 31 is prepared by mixing the polysilazane solution, the nanocomposite powder and the xylene solution, and the nanocomposite is made of indium oxide nanopowder, zinc oxide powder and anhydrous ethanol. The B electrode 32 is prepared by mixing the polysilazane solution, the indium oxide nanopowder, and the xylene solution. In terms of structure, in the preparation of the protective layer precursor layer, titanium diboride nanopowder and YSZ nanopowder are mixed into the polysilazane solution, and the protective layer precursor is obtained after vacuum heating and curing treatment. The the protective layer precursor is taken as the target material, the protective layer precursor is deposited on the top surface of the A electrode 31 and the top surface of the B electrode 32 by pulsed laser, and then vacuum pyrolyzed to obtain the protective layer precursor layer, which has strong oxidation resistance, which can protect the polymer-derived ceramic sensitive film from oxidation. In terms of process, the polymer-derived ceramic A slurry is directly written on the alumina ceramic sheets and the polymer-derived ceramic B slurry is directly written on the alumina ceramic sheets by adopting the Weissenberg direct writing process, and then heated in a vacuum drying oven to make polymer-derived ceramic A slurry and the polymer-derived ceramic B slurry cured and cross-linked, finally placed in the vacuum tube furnace for sintering to obtain the A electrode 31 and B electrode 32. The protective layer precursor layer is fabricated by PLD, which maintains the compositional consistency between the thin film and the protective layer. On one hand, vacuum pyrolysis enables the precursor ceramic organic slurry to acquire conductive functionality, thereby producing a conductive sensitive film. On the other hand, thermal effects generate greater adhesion between the film layers.

Example 3

On the basis of example 1, this example provides a method for preparing a polymer-derived ceramic thin film thermocouple, including:

S1, pretreatment: the alumina ceramic sheets are cleaned and dried in sequence;

specifically, in S1, the length×width×thickness of the alumina ceramic sheet is 80 mm×20 mm×1 mm. The surface of the alumina ceramic sheet with a size of 80 mm×20 mm×1 mm is ultrasonically cleaned with acetone, anhydrous ethanol and deionized water for 15 min. After cleaning, the surface of the alumina ceramic sheet is dried with a nitrogen gun, and then dried at 100° C.;

S2, preparation of the nanocomposite powder: indium oxide nanopowder and zinc oxide powder are mixed in a predetermined ratio, and the mixed powder and anhydrous ethanol are mixed in a predetermined ratio and placed in the ball milling tank of the ball mill; the ball mill is controlled to grind, and the mixture is dried to obtain nanocomposite powder;

specifically, in S2, the indium oxide nanopowder and the zinc oxide powder are mixed according to the first preset mass ratio $k_1$, the mixed powder and anhydrous ethanol are mixed according to the second preset mass ratio $k_2$; the rotational speed of the ball mill during grinding is the preset rotational speed n, and the grinding duration is the first preset duration $t_1$; the temperature at the time of the drying treatment is the first preset temperature $T_1$;

wherein the $k_1$, $k_2$, n, $t_1$ and $t_1$ satisfy: $3 \leq k_1 \leq 5$, $0.1 \leq k_2 \leq 1$, 1600 rpm$\leq$n$\leq$2400 rpm, 4 h$\leq t_1 \leq$6 h, 80° C.$\leq T_1 \leq$120° C.;

preferably, $k_1$=4, $k_2$=0.5, n=2000 rpm, $t_1$=5 h, $T_1$=100° C.;

S3, preparation of the A mixed slurry and the B mixed slurry: the polysilazane solution, the nanocomposite powder and the xylene solution are mixed in a predetermined ratio to obtain the A mixed slurry; the polysilazane solution, the indium oxide nanopowder and the xylene solution are mixed in a predetermined ratio to obtain the B mixed slurry;

specifically, in S3, the polysilazane solution, the nanocomposite powder and the xylene solution are mixed according to the third preset mass ratio $k_3$ to obtain the A mixed slurry; the polysilazane solution, the indium oxide nanopowder and the xylene solution are mixed according to the fourth preset mass ratio $k_4$ to obtain the B mixed slurry; wherein the $k_3$ and $k_4$ satisfy: 1:1: $3 \leq k_3 \leq$1:1:1, 1:1:$3 \leq k_4 \leq$1:1:1; preferably, $k_3$=$k_4$=1:1:2;

S4, preparation of the polymer-derived ceramic A slurry and the polymer-derived ceramic B slurry: the A mixed slurry is magnetically stirred at the normal temperature by the magnetic stirrer 41 to obtain the polymer-derived ceramic A slurry; the B mixed slurry is magnetically stirred at the normal temperature by the magnetic stirrer 41 to obtain the polymer-derived ceramic B slurry;

specifically, in S4, the magnetic stirring time of A mixed slurry and B mixed slurry at room temperature is 120 min;

S5, preparation of the A electrode and the B electrode: in the Weissenberg direct writing device, the polymer-derived ceramic A slurry is directly written on the alumina ceramic sheets and the polymer-derived ceramic B slurry is directly written on the alumina ceramic sheets by adopting the Weissenberg direct writing process (CN110962220B has been published); then, the alumina ceramic sheets directly written with the polymer-derived ceramic A slurry and the polymer-derived ceramic B slurry are placed in the vacuum drying oven for heating and curing treatment, so that polymer-derived ceramic A slurry and the polymer-derived ceramic B slurry are cured and cross-linked, and then placed in the vacuum tube furnace for sintering to obtain the A electrode 31 and B electrode 32;

specifically, in S5, the alumina ceramic sheets directly written with the polymer-derived ceramic A slurry and the polymer-derived ceramic B slurry are placed in the vacuum drying oven for heating and curing treatment, and the temperature during the heat curing treatment is the second preset temperature $T_2$, and the duration is the second preset duration $t_2$;

wherein the $T_2$ and $t_2$ satisfy: 100° C.$\leq T_2 \leq$300° C., 0.4 h$\leq t_2 \leq$0.6 h;

preferably, $T_2$=200° C., $t_2$=0.5 h;

The alumina ceramic sheets directly written with the polymer-derived ceramic A slurry and the polymer-derived ceramic B slurry are placed in the vacuum tube furnace for sintering includes:

firstly, the temperature is raised to the third preset temperature $T_3$ at the preset heating rate $v_1$, and the temperature is maintained for the third preset duration $t_3$, in this process, the polymer-derived ceramic A slurry and the polymer-derived ceramic B slurry undergo organic to inorganic transformation, and amorphous ceramic is generated;

secondly, the temperature is raised to the fourth preset temperature $T_4$ at the preset heating rate $v_1$, and the temperature is maintained for the fourth preset duration $t_4$, in this process, the amorphous ceramic undergoes phase separation and crystallization to generate the polycrystalline ceramic; and finally, the annealing treatment is performed by cooling the temperature to 1200° C. at the preset cooling rate $v_2$.

wherein $v_1$ and $v_2$ satisfy: 3° C./min$\leq v_{1\leq 7}$° C./min, 3° C./min$\leq v_{2\leq 7}$° C./min; the $T_3$ and $t_3$ satisfy: 900° C.$\leq T_3\leq 1100$° C., 3 h$\leq t_3\leq 5$ h; the $T_4$ and $t_4$ satisfy: 1400° C.$\leq T_4\leq 1800$° C.; 3 h$\leq t_4\leq 5$ h.

preferably, $v_1=v_2=5$° C./min; $t_3=1000$° C., $t_3=4$ h, $T_4=1600$° C., $t_4=4$ h;

S6, preparation of protective layer precursor layer: the ceramic sheet with polymer-derived ceramic sensitive film is annealed at high temperature in a vacuum tube furnace for a long time, so that the polymer-derived ceramic film forms a more stable oxide phase to protect the unoxidized part below, cooled to room temperature, and taken out. The temperature of the annealing treatment is the ninth preset temperature $T_9$, and the duration is the ninth preset duration $t_9$;

wherein $T_9$ and to satisfy: 1000° C.$\leq T_9\leq 1400$° C., 8 h$\leq t_9\leq 12$ h;

preferably, $T_9=1200$° C., $t_9=10$ h.

Specifically, the polymer precursor is directly annealed to form a stable oxide phase, which has the following advantages: ① crystal growth: with further increase in annealing temperature, the formed oxide phase may undergo a crystal growth process to form a more ordered crystal structure, thereby improving the hardness and stability of the material; ② densification: during the annealing process, the material may undergo densification, that is, pore reduction and density increase, which helps enhance the mechanical strength and chemical corrosion resistance of the material; ③ stress release: during heat treatment, stress may be generated between the polymer precursor and the formed oxide due to differences in thermal expansion coefficients, and proper annealing can release these stresses and prevent material cracking; ④ surface and interface optimization: the annealing process can improve the surface and interface characteristics of the material, thereby enhancing its overall properties.

S7, preparation of the solder joint 34: the titanium diboride nanopowder and polysilazane solution are mixed according to the fifth preset mass ratio $k_5$ to obtain the conductive slurry, the conductive slurry is applied on the alumina ceramic sheets and sintered to obtain the solder joints 34; the solder joints 34 and lead wires are electrically connected and placed them in the vacuum tube furnace for sintering; they are taken out after cooling to room temperature;

the temperature at which the solder joint and the lead wire are electrically connected and placed in the vacuum tube furnace for sintering is the sixth preset temperature $T_6$, and the duration is the sixth preset duration to;

wherein $k_5$ satisfies: 1:3$\leq k_5\leq 1$:1; $T_6$ and to satisfy: 700° C.$\leq T_6\leq 900$° C., 0.5 h$\leq t_6\leq 1.5$ h;

preferably, $k_5=2$:3; $T_6=800$° C., $t_6=1$ h.

In summary, the present disclosure adopts vacuum pyrolysis to prepare the precursor ceramic thin film thermocouple, which is different from the conventional pyrolysis to prepare the precursor ceramic thin film under protective gas such as argon and nitrogen. The vacuum pyrolysis can make the precursor ceramic organic slurry have a conductive function and can prepare the conductive sensitive film while simultaneously, due to the thermal effect, generating a large adhesive force between the film layers.

The above describes and illustrates specific examples of the present disclosure. It should be understood that the present disclosure is not limited to the detailed structures, configurations, or implementation methods described herein; rather, the present disclosure is intended to cover various modifications and equivalent configurations within the spirit and scope of the appended claims.

What is claimed is:

1. A method for preparing a polymer-derived ceramic thin film thermocouple configured for monitoring a surface temperature of a hot component; wherein the polymer-derived ceramic thin film thermocouple comprises an A electrode (31) and a B electrode (32);

wherein one end of the A electrode (31) and one end of the B electrode (32) intersect and overlap to form hot junctions (33), wherein an other end of the A electrode (31) away from the hot junctions (33) and an other end of the B electrode (32) away from the hot junctions (33) are provided with solder joints (34);

wherein the A electrode (31) is prepared by mixing a polysilazane solution, nanocomposite powder and a xylene solution; the B electrode (32) is prepared by mixing a polysilazane solution, indium oxide nanopowder, and a xylene solution; and wherein the nanocomposite powder is prepared by mixing indium oxide nanopowder, zinc oxide powder and anhydrous ethanol;

wherein each solder joint (34) is connected to a lead wire (35) and the lead wire (35) is configured for outputting a signal;

wherein the method comprises:

S1, pretreatment: cleaning and drying alumina ceramic sheets;

S2, preparation of the nanocomposite powder: mixing the indium oxide nanopowder and the zinc oxide powder according to a first preset mass ratio $k_1$ to obtain a mixed powder, mixing the mixed powder and the anhydrous ethanol according to a second preset mass ratio $k_2$ to obtain a mixture and placing the mixture in a ball milling tank of a ball mill; controlling the ball mill to grind, and drying the mixture to obtain the nanocomposite powder; wherein a rotational speed of the ball mill during grinding is a preset rotational speed n, and a grinding duration is a first preset duration $t_1$; and a temperature at a time of drying is a first preset temperature $T_1$;

wherein the $k_1$, $k_2$, n, $t_1$ and $T_1$ satisfy: 3$\leq k_1\leq 5$, 0.1$\leq k_2\leq 1$, 1600 rpm$\leq n\leq 2400$ rpm, 4 h$\leq t_1\leq 6$ h, 80° C.$\leq T_1\leq 120$° C.;

S3, preparation of an A mixed slurry and a B mixed slurry, comprising: mixing the polysilazane solution, the nanocomposite powder and the xylene solution according to a third preset mass ratio $k_3$ to obtain the A mixed slurry; mixing the polysilazane solution, the indium oxide nanopowder and the xylene solution according to a fourth preset mass ratio $k_4$ to obtain the B mixed slurry; wherein the $k_3$ and $k_4$ satisfy: 1:1:3$\leq k_3\leq 1$:1:1, 1:1: 3$\leq k_4\leq 1$:1:1;

S4, preparation of a polymer-derived ceramic A slurry and a polymer-derived ceramic B slurry, comprising: magnetically stirring the A mixed slurry at a room temperature to obtain the polymer-derived ceramic A slurry; magnetically stirring the B mixed slurry at the room temperature to obtain the polymer-derived ceramic B slurry;

S5, preparation of the A electrode (31) and the B electrode (32) comprising:

directly writing the polymer-derived ceramic A slurry on the alumina ceramic sheets and directly writing the polymer-derived ceramic B slurry on the alumina ceramic sheets by adopting a Weissenberg direct writing process; then, placing the alumina ceramic sheets directly written with the polymer-derived ceramic A slurry and the polymer-derived ceramic B slurry in a vacuum drying oven for heating and curing treatment, and then placing the alumina ceramic sheets directly written with the polymer-derived ceramic A slurry and the polymer-derived ceramic B slurry in a vacuum tube furnace for sintering to obtain the A electrode (31) and the B electrode (32);

wherein, in S5, the placing the alumina ceramic sheets directly written with the polymer-derived ceramic A slurry and the polymer-derived ceramic B slurry in the vacuum tube furnace for sintering comprises:

firstly, raising to a third preset temperature $T_3$ at a preset heating rate 11, and maintaining the temperature for a third preset duration $t_3$, wherein, in this process, the polymer-derived ceramic A slurry and the polymer-derived ceramic B slurry undergo organic to inorganic transformation, and amorphous ceramic is generated;

secondly, raising the temperature to a fourth preset temperature $T_4$ at the preset heating rate $v_1$, and maintaining the temperature for a fourth preset duration $t_4$, wherein, in this process, the amorphous ceramic undergoes phase separation and crystallization to generate a polycrystalline ceramic; and finally, cooling the temperature to room temperature at a preset cooling rate 12;

wherein $v_1$ and $v_2$ satisfy: 3° C./min$\leq v_1 \leq$7° C./min, 3° C./min$\leq v_2 \leq$7° C./min; the $T_3$ and $t_3$ satisfy: 900° C.$\leq T_3 \leq$1100° C., 3 h$\leq t_3 \leq$5 h; the $T_4$ and $t_4$ satisfy: 1400° C.$\leq T_4 \leq$1800° C.; 3 h$\leq t_4 \leq$5 h;

S6, preparation of the solder joints (34) comprising: mixing titanium diboride nanopowder and polysilazane solution according to a fifth preset mass ratio $k_5$ to obtain a conductive slurry, applying the conductive slurry on the alumina ceramic sheets and sintering to obtain the solder joints (34); electrically connecting the solder joints (34) and lead wires (35) and placing them in the vacuum tube furnace for sintering; wherein the $k_5$ satisfies: 1:3$\leq k_5 \leq$1:1; and S7, preparation of a protective layer precursor layer: mixing the titanium diboride nanopowder and yttria-stabilized zirconia (YSZ) nanopowder according to a sixth preset mass ratio $k_6$, incorporating into the polysilazane solution, and placing into the vacuum drying oven for heating and curing treatment, and then obtaining a protective layer precursor; wherein a temperature at a time of the heat and curing treatment is a seventh preset temperature $T_7$, and a duration for the heat and curing treatment is a seventh preset duration $t_7$;

masking the alumina ceramic sheets directly written with the A electrode (31) and the B electrode (32), taking the protective layer precursor as a target material, depositing the protective layer precursor on a top surface of the A electrode (31) and a top surface of the B electrode

(32) by pulsed laser, and then vacuum pyrolyzing to obtain the protective layer precursor layer; and, during vacuum pyrolysis, raising the temperature to an eighth preset temperature $T_8$ at the preset heating rate $v_1$ and maintaining the temperature for an eighth preset duration $t_8$;

wherein the $k_6$ satisfies: 3:1$\leq k_6 \leq$5:1; the Ty and t satisfy: 100° C.$\leq T_1 \leq$300° C., 0.4 h$\leq t_7 \leq$0.6 h; the $v_1$ satisfies: 3° C./min$\leq v_1 \leq$7° C./min; $T_8$ and $t_8$ satisfy: 1400° C.$\leq T_8 \leq$1800° C., 3 h$\leq t_8 \leq$5 h.

2. The method for preparing the polymer-derived ceramic thin film thermocouple according to claim 1, wherein in the nanocomposite powder, an average particle diameter of the indium oxide nanopowder is $d_1$, an average particle diameter of the zinc oxide nanopowder is $d_2$, and the $d_1$ and $d_2$ satisfy: 50 nm$\leq d_1 \leq$100 nm, 20 nm$\leq d_2 \leq$100 nm;

wherein, in the B electrode (32), an average particle diameter of the indium oxide nanopowder is $d_3$, and $d_3$ satisfies: 20 nm$\leq d_3 \leq$20 um; and a thickness of the A electrode (31) is $H_A$, a thickness of the B electrode (32) is $H_B$, and the $H_A$ and $H_B$ satisfy: 2 um$<H_A \leq$100 um, 2 um$<H_B \leq$100 um.

3. The method for preparing the polymer-derived ceramic thin film thermocouple according to claim 1, wherein the lead wire (35) has a filamentous structure, the lead wire (35) is a platinum wire, and a diameter of the lead wire (35) is $d_0$, and the $d_0$ satisfies: 160 um$\leq d_0 \leq$240 um.

4. The method for preparing the polymer-derived ceramic thin film thermocouple according to claim 1, wherein in S5, the alumina ceramic sheets directly written with the polymer-derived ceramic A slurry and the polymer-derived ceramic B slurry are placed in the vacuum drying oven for heating and curing treatment, and a temperature during the heat and curing treatment is a second preset temperature $T_2$, and a duration for the heat and curing treatment is a second preset duration $t_2$;

wherein the $T_2$ and $t_2$ satisfy: 100° C.$\leq T_2 \leq$300° C., 0.4 h$\leq t_2 \leq$0.6 h.

5. The method for preparing the polymer-derived ceramic thin film thermocouple according to claim 4, wherein S5 further comprises:

placing the alumina ceramic sheets directly written with the A electrode (31) and the B electrode (32) in the vacuum tube furnace at high temperature for annealing treatment, so that a layer of oxidized phase is formed on a surface of the A electrode (31) and a surface of the B electrode (32); a temperature at a time of the annealing treatment is a fifth preset temperature $T_5$, and a duration for the annealing treatment is a fifth preset duration $t_5$;

wherein $T_5$ and ty satisfy: 1000° C.$\leq T_5 \leq$1400° C., 8 h$\leq t_5 \leq$12 h.

6. The method for preparing the polymer-derived ceramic thin film thermocouple according to claim 1, wherein in S6, a temperature at which the solder joints (34) and the lead wire (35) are electrically connected and placed in the vacuum tube furnace for sintering is a sixth preset temperature $T_6$, and a duration for sintering is a sixth preset duration $t_6$;

wherein $T_6$ and to satisfy: 700° C.$\leq T_6 \leq$900° C., 0.5 h$\leq t_6 \leq$1.5 h.

7. The method for preparing the polymer-derived ceramic thin film thermocouple according to claim 1, wherein a thickness of the protective layer precursor layer is $H_C$, and the $H_C$ satisfies: 2 um$<H_C \leq$100 um.

* * * * *